(12) United States Patent
Joshi

(10) Patent No.: US 6,953,998 B2
(45) Date of Patent: *Oct. 11, 2005

(54) UNMOLDED PACKAGE FOR A SEMICONDUCTOR DEVICE

(75) Inventor: Rajeev Joshi, Cupertino, CA (US)

(73) Assignee: Fairchild Semiconductor, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/754,095

(22) Filed: Dec. 29, 2003

(65) Prior Publication Data

US 2004/0164386 A1 Aug. 26, 2004

Related U.S. Application Data

(60) Continuation of application No. 10/235,249, filed on Sep. 4, 2002, now Pat. No. 6,740,541, which is a division of application No. 09/776,341, filed on Feb. 1, 2001, now Pat. No. 6,469,384.

(51) Int. Cl.[7] .............................................. H01L 23/48
(52) U.S. Cl. ....................... 257/777; 257/679; 257/738; 257/778
(58) Field of Search ................................. 257/679, 738, 257/777, 778

(56) References Cited

U.S. PATENT DOCUMENTS

| | | | |
|---|---|---|---|
| 5,477,082 A | * 12/1995 | Buckley et al. | ............. 257/679 |
| 5,616,958 A | 4/1997 | Laine et al. | |
| 5,637,916 A | 6/1997 | Joshi | |
| 5,765,280 A | 6/1998 | Joshi | |
| 5,777,386 A | 7/1998 | Higashi et al. | |
| 5,789,809 A | 8/1998 | Joshi | |
| 6,023,094 A | 2/2000 | Kao et al. | |
| 6,049,624 A | 4/2000 | Wilson et al. | |
| 6,084,308 A | 7/2000 | Kelkar et al. | |
| 6,133,634 A | 10/2000 | Joshi | |
| 6,137,164 A | 10/2000 | Yew et al. | |
| 6,168,973 B1 | * 1/2001 | Hubbard | ..................... 438/109 |
| 6,175,162 B1 | 1/2001 | Kao et al. | |
| 6,225,699 B1 | * 5/2001 | Ference et al. | ............. 257/777 |
| 6,294,403 B1 | 9/2001 | Joshi | |
| 6,462,421 B1 | 10/2002 | Hsu et al. | |
| 6,469,384 B2 | * 10/2002 | Joshi | ......................... 257/738 |
| 6,479,903 B2 | * 11/2002 | Briar | ......................... 257/778 |
| 6,489,678 B1 | 12/2002 | Joshi | |
| 6,566,749 B1 | 5/2003 | Joshi et al. | |
| 6,627,991 B1 | 9/2003 | Joshi | |
| 6,633,030 B2 | 10/2003 | Joshi | |
| 6,661,082 B1 | 12/2003 | Granada et al. | |
| 6,683,375 B2 | 1/2004 | Joshi et al. | |
| 6,696,321 B2 | 2/2004 | Joshi | |
| 2002/0066950 A1 | 6/2002 | Joshi | |
| 2002/0066959 A1 | 6/2002 | Joshi | |

(Continued)

OTHER PUBLICATIONS

"Flex interconnect of Multi–Chi Modules"; IBM Technical Disclosure Bulletin No. NN9312463; Dec. 1993; pp. 463–464; vol. 36, No. 12.

*Primary Examiner*—David Nelms
*Assistant Examiner*—Dao H. Nguyen
(74) *Attorney, Agent, or Firm*—Townsend and Townsend and Crew LLP

(57) ABSTRACT

A semiconductor device that does not include a molded body or package. The semiconductor device includes a substrate and a die coupled to the substrate. The die is coupled to the substrate such that the source and gate regions of the die, assuming a MOSFET-type device, are coupled to the substrate. Solder balls are provided adjacent to the die such that when the semiconductor device is coupled to a printed circuit board, the exposed surface of the die serves as a drain connection while the solder balls serve as the source and gate connections.

5 Claims, 3 Drawing Sheets

U.S. PATENT DOCUMENTS

| | | |
|---|---|---|
| 2002/0100962 A1 | 8/2002 | Joshi |
| 2002/0192935 A1 | 12/2002 | Joshi et al. |
| 2003/0011005 A1 | 1/2003 | Joshi |
| 2003/0042403 A1 | 3/2003 | Joshi |
| 2003/0075786 A1 | 4/2003 | Joshi et al. |
| 2003/0107126 A1 | 6/2003 | Joshi |
| 2003/0122247 A1 | 7/2003 | Joshi |
| 2003/0173684 A1 | 9/2003 | Joshi et al. |
| 2003/0197278 A1 | 10/2003 | Joshi et al. |
| 2004/0041242 A1 | 3/2004 | Joshi |
| 2004/0056364 A1 | 3/2004 | Joshi et al. |

* cited by examiner

UNMOLDED PACKAGE FOR A SEMICONDUCTOR DEVICE

CROSS REFERENCE TO RELATED APPLICATIONS

This application is a continuation application of U.S. patent application Ser. No. 10/235,249, filed on Sep. 4, 2002 now U.S. Pat. No. 6,740,541, which is a divisional application of U.S. patent application Ser. No. 09/776,341, filed Feb. 1, 2001, now U.S. Pat. No. 6,469,384, which are herein incorporated by reference in their entirety for all purposes.

BACKGROUND OF THE INVENTION

1. Field of the Invention

The present invention relates to a package for a semiconductor device, and more particularly, to a package for a semiconductor device that does not require a molded body.

2. Description of the Prior Art

Semiconductor devices, especially MOSFET devices, generally desire very low package resistance (RDSon) with good thermal performance. It is also generally desirable to have simple, quick and efficient methods of packaging semiconductor devices. Thus, numerous packaging concepts and methods have been developed in the prior art.

An example of one such packaging concept involves a ball grid array (BGA). Such a concept involves an array of source, gate and drain solder balls that are connected directly to the printed circuit board (PCB). This requires a bumped die and a leadframe is used to facilitate the drain contact. Another packaging concept is commonly referred to as Flip Chip in Leaded Molded Package (FLMP), which comprises a molded leaded surface mount package where a bumped die is connected to gate and source terminals of the frame. The drain, which is the back side of the die, is exposed from the mold compound or body and is connected to the PCB via solder reflow during a standard board mounting process. Other packaging concepts use copper straps and/or wire bond technology.

These prior art concepts involve various components and may result in complicated manufacturing (packaging) processes.

SUMMARY OF THE INVENTION

The present invention provides a semiconductor device that includes a substrate and a die coupled to the substrate. Multiple solder balls are also coupled to the substrate adjacent to the die. The solder balls are substantially coplanar with a surface of the die when the semiconductor device is coupled to a printed circuit board. Thus, when the semiconductor device is coupled to a PCB, the surface of the die not coupled to the substrate serves as a direct drain connection while the substrate and solder balls serve as the source and gate connections in the instance when the semiconductor device is a MOSFET device.

In accordance with one aspect of the present invention, the substrate includes a base layer, a metal layer and an insulating layer between the base layer and the metal layer.

In accordance with another aspect of the present invention, the base layer comprises a metallized pattern and the metal layer comprises another metallized pattern or serves as a heat spreader.

In accordance with a further aspect of the present invention, the substrate is a metallized ceramic.

In accordance with yet another aspect of the present invention, the substrate comprises two layers of metallized ceramic which can facilitate attachment of two dies (silicon) on opposite faces.

The present invention also provides a method of packaging a semiconductor device that includes providing a substrate and a die. The solder, or any suitable electrically conductive interconnect in the case of MOSFET devices, is placed on at least one of the substrate and the die and the die is flipped onto the substrate. The solder balls are then placed on the substrate adjacent to the die.

Other features and advantages of the present will be understood upon reading and understanding the detailed description of the preferred exemplary embodiments found hereinbelow, in conjunction with reference to the drawings, in which like numerals represent like elements.

DETAILED DESCRIPTION OF SPECIFIC EMBODIMENTS

Figure 1:
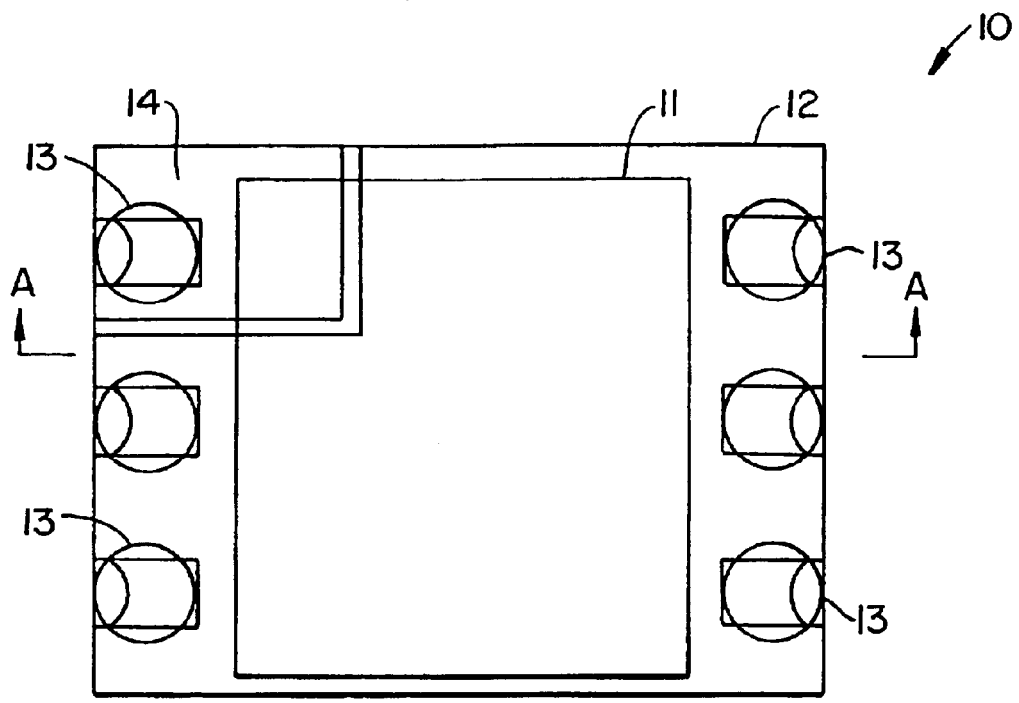
FIG. 1 is a plan view a semiconductor device in accordance with the present invention.

FIG. 1 illustrates a MOSFET semiconductor device 10 that includes a die 11, a substrate 12 and solder balls 13. The substrate includes a gate region 14.

Figure 2:
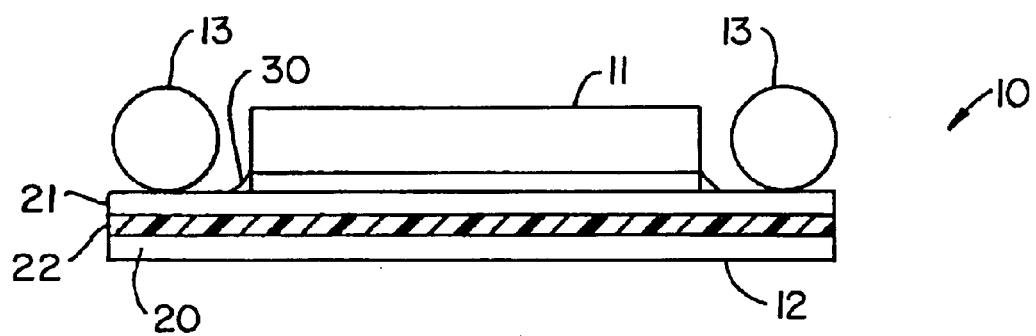
FIG. 2 is a side sectional view of the semiconductor device illustrated in FIG. 1 as seen along the line A—A.

As can be seen in FIG. 2, the substrate preferably comprises a base layer 20 and a top, metal layer 21. The base layer and the top metal layer are separated by an insulting layer 22, preferably an insulating epoxy that joins the two layers. The base material preferably comprises a metallized pattern while the top metal layer preferably comprises another metallized pattern. The metal layer may also serve as a heat spreader.

The die 11 preferable coupled to the substrate 12 with high temperature solder paste 30, but may also be coupled with any other suitable conductive interconnect known in the art. The solder balls are placed adjacent the die on opposite sides of the die, with at least one solder ball being placed on the gate region of the substrate.

Thus, in use, the semiconductor device is placed on a printed circuit board and the surface of the die is coupled directly to the PCB with solder paste or suitable electrically conductive interconnect, and thus serves as the drain connection. The surface of the die coupled to the substrate comprises the gate region and the source region of the die. Thus, the solder ball in the gate region of the substrate serves to couple the gate region of the die to the PCB while the remaining solder balls couple the source region of the die through the substrate to the PCB. Accordingly, the gate region of the substrate is electrically isolated from the remaining portion of the substrate.

A method of making or packaging such a semiconductor device includes placing the solder paste on one of the substrate or the die and flip chip attaching the die to the substrate. Solder balls are then placed on the substrate adjacent the die. Preferably, this combination is then tested. The semiconductor device is then trimmed and the semiconductor device is retested.

The solder balls are placed at a height such that when the semiconductor device is coupled to a PCB, the solder balls are substantially coplanar with the drain surface of the die, thus allowing the semiconductor device to be flush on the PCB.

In an alternative embodiment, the solder balls are not placed on the semiconductor device, but rather are placed on the PCB and the semiconductor device is then coupled thereto.

Figure 3:
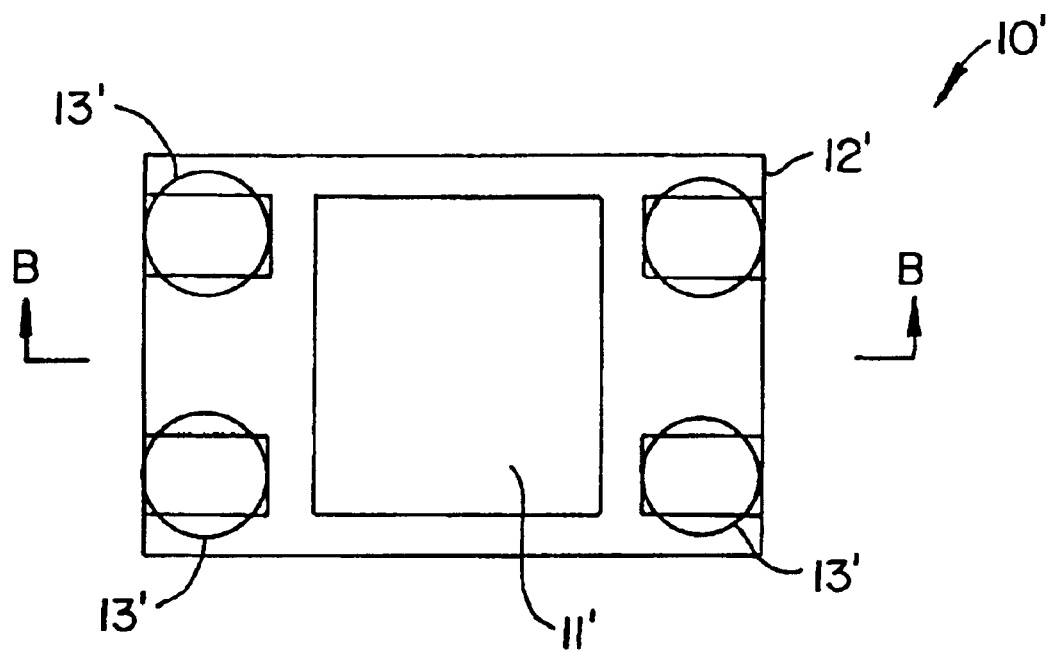
FIG. 3 is a plan view of another semiconductor device in accordance with the present invention.

With reference to FIG. 3, an alternative embodiment of the semiconductor device in accordance with the present invention is illustrated. In this embodiment, the substrate comprises a metallized ceramic. Examples of materials for the substrate include insulated metal substrate.

In such an embodiment, the exposed surface of the die serves as the drain connection to the PCB while the solder balls serve as the gate and source connections to the PCB.

Figure 4:
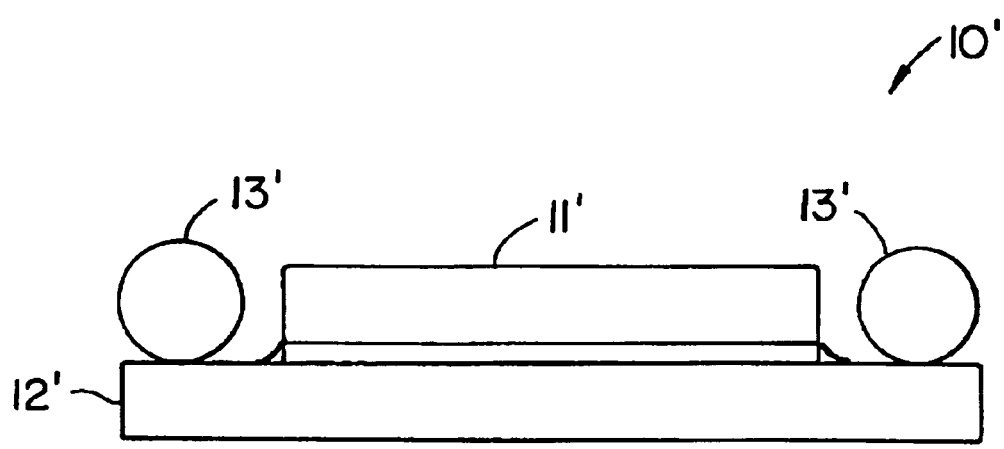
FIG. 4 is a side sectional view of the semiconductor device illustrated FIG. 3 as seen along the line B—B.

The device illustrated in FIGS. 3 and 4 is manufactured in a manner similar to that described above with reference to the semiconductor device illustrated in FIGS. 1 and 2.

Thus, the present invention provides a semiconductor device that provides improved heat dissipation of the device since the die backside is soldered directly to the PCB and the source and gate of the MOSFET are soldered to a substrate, preferably via high temperature solder paste. Thus, the die need not be a bumped die but rather, needs a solderable top metal surface such as, for example, an electroless Nickel (or electrolytic Nickel) with a gold outer layer. Furthermore, the assembly process is simplified considerably since it does not involve form factor dedicated operations like wire bond, mold, deflash, trim and form, and plating. Also, the footprint is now changeable for the semiconductor arrangement since the solder balls are moveable during the design process.

Figure 5:
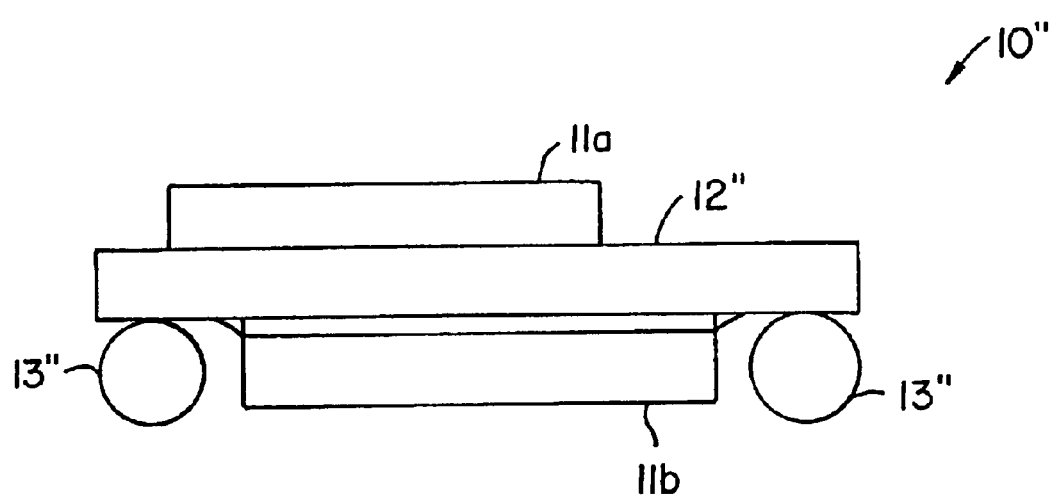
FIG. 5 is a side sectional view of an alternative embodiment in accordance with the present invention.

As can be seen in FIG. 5, the present invention also allows for easily combining two or more dies 11a, b in a high density packaging scheme (one or more die on each side of the substrate 12). In doing so, an easy method of high density integration can be achieved without the use of conventional methods of surface mount package manufacture and that is form factor independent of steps such as mold, deflash, trim and form tooling. The substrate comprises two layers of metallized ceramic that are separated with an insulation layer or are otherwise electrically isolated. Thus, the placement of the solder balls determines each die's source and gate connections. If it is desired to connect die 11b's drain to the PCB, known techniques such as wire bonding may be used.

Although the invention has been described with reference to specific exemplary embodiments, it will be appreciated that is intended to cover all modifications and equivalents within the scope of the appended claims.

What is claimed is:

1. A semiconductor device comprising:
    a substrate comprising a first side and a second side;
    a semiconductor die comprising a periphery and being coupled to the first side of the substrate, the semiconductor die comprising a first surface comprising a drain, and a second surface opposite the first surface, wherein the second surface comprises source and gate regions; and
    conductive structures coupled to the substrate outside of the periphery of the semiconductor die, wherein ends of the conductive structures are substantially coplanar with the first and second surfaces of the semiconductor die and wherein the conductive structures provide communication between the source and gate regions at the second surface of the semiconductor die and a printed circuit board, and
    wherein the first surface of the semiconductor die comprising the drain is proximate the circuit board and the second surface comprising the source and gate regions is distal to the circuit board.

2. The semiconductor device of claim 1 wherein there is no underfill material between the substrate and the printed circuit board.

3. The semiconductor device of claim 1 wherein the conductive structures comprise solder.

4. The semiconductor device of claim 1 wherein the substrate is an insulated metal substrate.

5. The semiconductor device of claim 1 wherein the semiconductor die is a first die and wherein the semiconductor device comprises a second die on the second side of the substrate.

* * * * *